United States Patent [19]
Herz et al.

[11] Patent Number: 5,235,530
[45] Date of Patent: Aug. 10, 1993

[54] ACTIVE CARTRIDGE DISPLAY FOR HARDWARE MODELER

[75] Inventors: John P. Herz, Larchmont; Douglas J. Hohlbein, Central Islip, both of N.Y.; Edward J. Lhotak, Jr., Allendale, N.J.; Christopher P. Montalbano, Great Neck; Anthony P. Montalbano, Bayville, both of N.Y.

[73] Assignee: Racal-Redac, Inc., Mahwah, N.J.

[21] Appl. No.: 614,428

[22] Filed: Nov. 15, 1990

[51] Int. Cl.⁵ .............................................. G06F 15/20
[52] U.S. Cl. .................................. 364/578; 371/29.1
[58] Field of Search ............... 364/578, 574; 371/29.1; 395/500

[56] References Cited
U.S. PATENT DOCUMENTS

| | | | |
|---|---|---|---|
| 4,590,581 | 5/1986 | Widdoes, Jr. | 364/578 |
| 4,635,218 | 1/1987 | Widdoes, Jr. | 364/578 |
| 4,744,084 | 5/1988 | Beck et al. | 364/578 |
| 4,750,136 | 6/1988 | Arpin et al. | 364/514 |
| 4,829,520 | 5/1989 | Toth et al. | 371/29.1 |

OTHER PUBLICATIONS

Huntloy et al., "Error Status Reporting", IBM Tech. Disclosure, vol. 22, No. 4, 1979.

Primary Examiner—Edward R. Cosimano
Assistant Examiner—Ellis B. Ramirez
Attorney, Agent, or Firm—Wolf, Greenfield & Sacks

[57] ABSTRACT

A status display for a hardware modeler includes an LCD panel which is divided into regions corresponding to cartridge banks and each region is further divided into sections corresponding to individual cartridges. The sections display relevant identifying information for its associated cartridge. If the cartridge is currently active, that information is shown in reverse video to indicate that the cartridge is active. The modeler can be paused by pressing a pause switch. The modeler's processor then inhibits activity of inactive cartridges and, at the next opportunity, inhibits activity of active cartridges so that the cartridges can be rearranged, etc. The status of the modeler as a whole is also displayed.

11 Claims, 4 Drawing Sheets

ACTIVE CARTRIDGE DISPLAY FOR HARDWARE MODELER

BACKGROUND

1. Field of the Invention

This invention relates generally to the field of circuit simulation devices including hardware modelers. More particularly, this invention relates to a method and apparatus for determining the status of device cartridges in a hardware modeler.

2. Background of the Invention

Circuit simulators are in common use for modeling the performance of complex electronic circuits. Often, complex circuits such as microprocessors and custom LSI and ASIC circuits are modeled by one of the actual circuits by using a hardware modeler. Such devices are commercially available as for example the CATS ® hardware modeler which is used in conjunction with the CADAT ® simulation software (both products produced by Racal-Redac, the assignee of the present invention). Hardware modeling has been described in, for example, U.S. Pat. Nos. 4,590,581 and 4,635,218 both to Widdoes, Jr. which are incorporated herein by reference.

Briefly, in hardware modeling, an actual device which is being modeled is used as a substitute for a software description of the device. Software descriptions are more common for simpler devices such as AND gates, OR gates, NOR gates, etc. Test vectors are applied to the device from the simulation software and the response of the device to this stimulation is fed back to the simulation software. In the case of many synchronous dynamic devices such as microprocessors, each time the hardware model is accessed, it must be initialized and each previous stimulation vector must be sequentially applied to the device so that it can be restored to the correct internal state prior to application of the current stimulation vector. Commercially available hardware modelers are arranged as banks or card cages of circuit boards or cartridges carrying the various hardware devices to be modeled. In addition, hardware modelers contain the timing and interfacing circuitry and memory necessary to operate the device to be modeled.

When simulation of a complex system with hundreds or thousands of nodes is taking place, the simulation process can often take hours even with modern high speed computers performing the simulation. This is particularly the case when performing fault simulation on such a circuit. In fault simulation of logic circuits, the circuit is simulated as a good circuit and then repeatedly as a circuit having a fault (short to logic high and logic low) at each node of the circuit. For a network of N nodes, this means a total of as many as 2N+1 simulations are carried out. Fault simulation of complex circuits can take days of computer time to complete.

In, for example the CATS ® modeler, the device cartridges are accessible through a smoked acrylic door to enable the operator to interchange hardware cartridges as required for the simulation at hand or perform other operations requiring access to the cartridge bank. The modeler itself may be connected to a local area network for access as a network resource by many users. The status of each cartridge can be determined by a display light on the cartridge itself. In this product and other existing products, only one cartridge may be active at any given time. However, in the preferred embodiment of present invention, more than one cartridge may be active at any given time.

In order to enhance the execution time of such simulations, it is desirable to operate a hardware model at the highest speed possible. This currently means having clock speeds for master clocks operating in the range of 25 Mhz or higher. As the devices being modeled are capable of operating at higher speeds, even higher clock speeds will be desired so that simulation can proceed more rapidly. This gives rise to problems with electromagnetic radiation emissions from the housing of the hardware modeler. It therefore becomes somewhat difficult to obtain suitable levels of emissions from a housing having a non-electrically conductive (glass, plastic, acrylic, etc.) door. Accordingly, a new mechanism to determine the operational status of a cartridge is required.

Since fault simulations can often occupy days of computer time, it is also desirable to make it more difficult for someone to inadvertently remove a cartridge which is being used by someone else on a network, thereby disrupting or "crashing" a simulation.

The present invention addresses these problems by providing a method and apparatus for display of the status of a hardware simulator cartridge and provides a mechanism to pause execution of the hardware model without disrupting an entire simulation.

SUMMARY OF THE INVENTION

It is an object of the present invention to provide an improved cartridge status display for a hardware modeler.

It is a feature that the present invention to provides a mechanism for pausing execution of a hardware modeler.

It is an advantage that the present invention permits a full display of status of a bank of cartridges in a hardware modeler to permit better shielding of the cartridges themselves since a transparent door is not needed.

These and other objects, advantages and features of the invention will become apparent to those skilled in the art upon consideration of the following description of the invention.

A status display for a hardware modeler includes an LCD panel which is divided into regions corresponding to cartridge banks and each region is further divided into sections corresponding to individual cartridges. The sections display relevant identifying information for its associated cartridge. If the cartridge is currently active, that information is shown in reverse video to indicate that the cartridge is active. The modeler can be paused by pressing a pause switch. The modeler's processor then inhibits activity of inactive cartridges and, at the next opportunity, inhibits activity of active cartridges so that the cartridges can be rearranged, etc. The status of the modeler as a is also displayed.

In one embodiment of the present invention, a status display system for a hardware modeler includes a cartridge bank for carrying and electrically interfacing with a plurality of hardware model cartridges. Each hardware model cartridge includes memory for storing identifying information for the hardware model cartridge. The identifying information is read from the memory of the hardware model cartridge it is determined whether or not the hardware model cartridge is active. A display displays at least a portion of the identifying information in a manner such that it is evident whether or not the hardware model cartridge is active.

A status display system for a hardware modeler includes a cartridge bank for carrying and electrically interfacing with a plurality of hardware model cartridges. Each hardware model cartridge includes memory for storing identifying information for the hardware model cartridge. The memory includes a Read Only Memory (ROM) and a switch for storing an address assigned to the hardware model cartridge. The identifying information is read from the storage means of the hardware model cartridge and it is determined if the hardware model cartridge is active. A display shows at least a portion of the identifying information. The display also shows whether or not the hardware model cartridge is active by displaying identifying information relating to an active hardware model cartridge in reverse video. A switch is provided for suspending operation of the hardware modeler, the switch being operable by a user, for inhibiting future calls to the hardware model cartridge when operated by the user and for uninhibiting the future calls to the hardware model cartridge upon operation of the switching means while the future calls are inhibited.

A method for displaying the status of hardware model cartridges for a hardware modeler according to the present invention, includes the steps of: storing identifying information for each of a plurality of hardware model cartridges in a memory forming a part of each of the plurality of the hardware model cartridges; reading the identifying information from the memory of the hardware model cartridges; determining if the hardware model cartridge is active; displaying at least a portion of the identifying information on a display; and displaying an indication of whether or not each the hardware model cartridge is active.

Another method for displaying the status of hardware model cartridges for a hardware modeler according to the present invention includes the steps of: storing identifying information for each of a plurality of hardware model cartridges in a memory forming a part of each of the plurality of the hardware model cartridges; sequentially reading the identifying information from each the memory of each of the hardware model cartridges; determining if the hardware model cartridge is active; displaying at least a portion of the identifying information on a display; displaying an indication of whether or not each the hardware model cartridge is active by displaying the portion of the identifying information with a reverse video display attribute; pausing operation of each of the hardware model cartridges and displaying an indication that the operation of the hardware model cartridges has been paused.

The features of the invention believed to be novel are set forth with particularity in the appended claims. The invention itself however, both as to organization and method of operation, together with further objects and advantages thereof, may be best understood by reference to the following description taken in conjunction with the accompanying drawing.

DETAILED DESCRIPTION OF THE INVENTION

Figure 1:
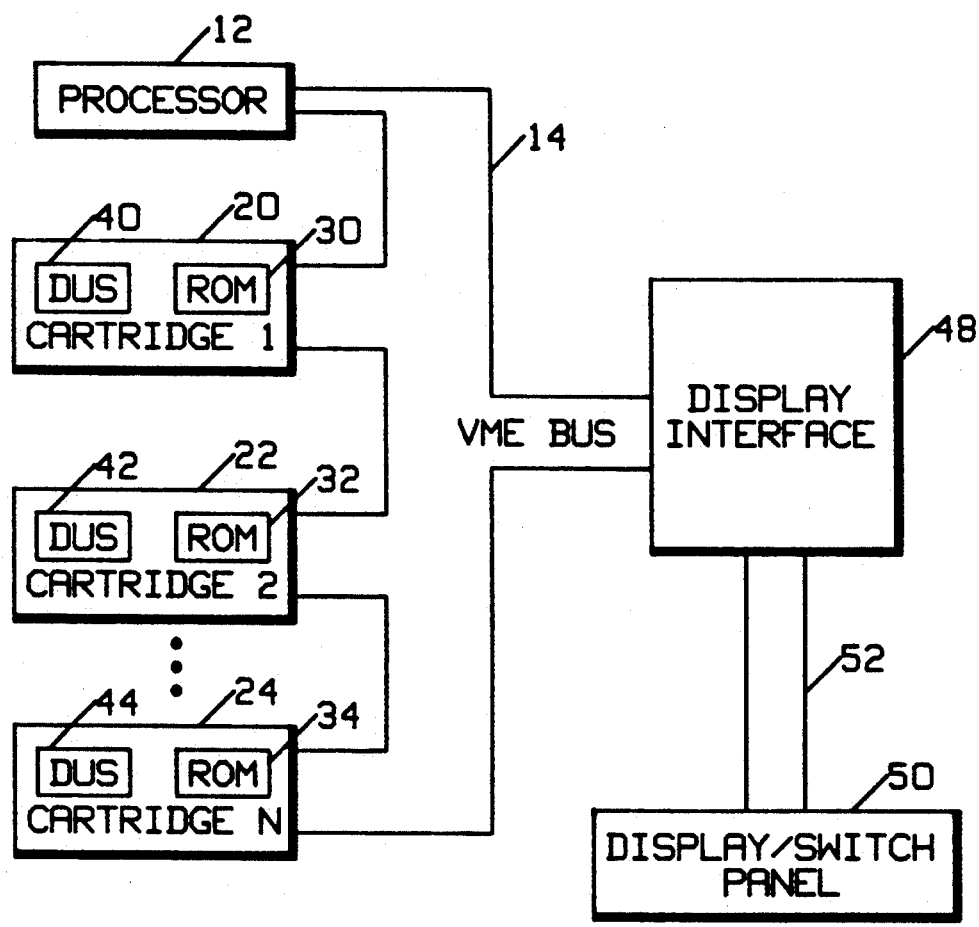
FIG. 1 is a block diagram of the status display system of the present invention.

Turning now to FIG. 1, the basic architecture of the improved status display system of the present invention is shown. A central processor 12 along with its associated memory is coupled to a bus such as the industry standard VME bus 14 (or other bus structure). A plurality of hardware cartridges such as 20, 22 and 24 containing the hardware devices being modeled are attached to the VME bus 14 also. (In the preferred embodiment, the cartridges are actually interfaced with a Pin Memory Controller Interface circuit which is in turn coupled to the VME bus. However, this is unimportant to the understanding of the present invention and should be considered equivalent for purposes of this discussion.)

Each cartridge 20, 22 and 24 includes a Read Only Memory (ROM) such as an electrically alterable ROM or EAROM 30, 32 and 34. Each respective ROM contains identifying information regarding a respective device under simulation (DUS) 40, 42 and 44 respectively. Each device also may include a switch such as a DIP (Dual Inline Package) switch which is used to set an address for the cartridge or other relevant information. While three cartridges are shown in the figure, those skilled in the art will appreciate that any suitable number, e.g. 30, such cartridges can be accommodated in such a hardware modeler.

Also connected to the VME bus 14 is a display interface circuit 48 which includes a display driver circuit which may be based upon, for example, the commercially available Yamaha V6366 general purpose display driver circuit. The display interface 48 is coupled to a display/switch panel 50 by a separate bus 52. The display/switch panel includes, for example, a 320×200 LCD or other display along with indicator lights and a pause switch as will be described later.

In operation, the processor 12, which may be a SUN SPARC TM or other suitable processor, is used to determine which cartridges are present in the cartridge bank of the hardware modeler. To provide enhanced shielding, the cartridges may be placed behind a shielded metal door. (In other embodiments, other shielding techniques may also be acceptable without deviating from the present invention.) The processor also reads the contents of the ROMs 30, 32 and 34 to determine what type of device is being carried in each cartridge. In addition, the processor is used to oversee the access to each cartridge in the cartridge bank. It therefore knows at any given time which cartridges are active and which are inactive. The processor may also be used to run the simulation software.

The information from the cartridge ROMs 30, 32 and 34 and other sources such as DIP switches located on the cartridges is formatted and sent to the display interface 48 which generates appropriate images for the display panel of display/switch panel 50 in a known manner. In the preferred embodiment, the processor informs the display interface of which cartridges are active and the display interface displays the information relating to those active cartridges in reverse video. In other embodiments, the active cartridges can be indicated by other means such as different color or different intensity.

The display/switch panel also includes a "PAUSE" switch and various status lights which are controlled by the processor. The "PAUSE" switch is used by the operator to temporarily pause operation of the hardware modeler prior to accessing the cartridge bank for service, reconfiguration, etc. The status lights are used to indicate whether or not the system is active, paused or in the process of being paused (wait). The operation of this feature is better understood upon consideration of FIG. 2.

Figure 2:
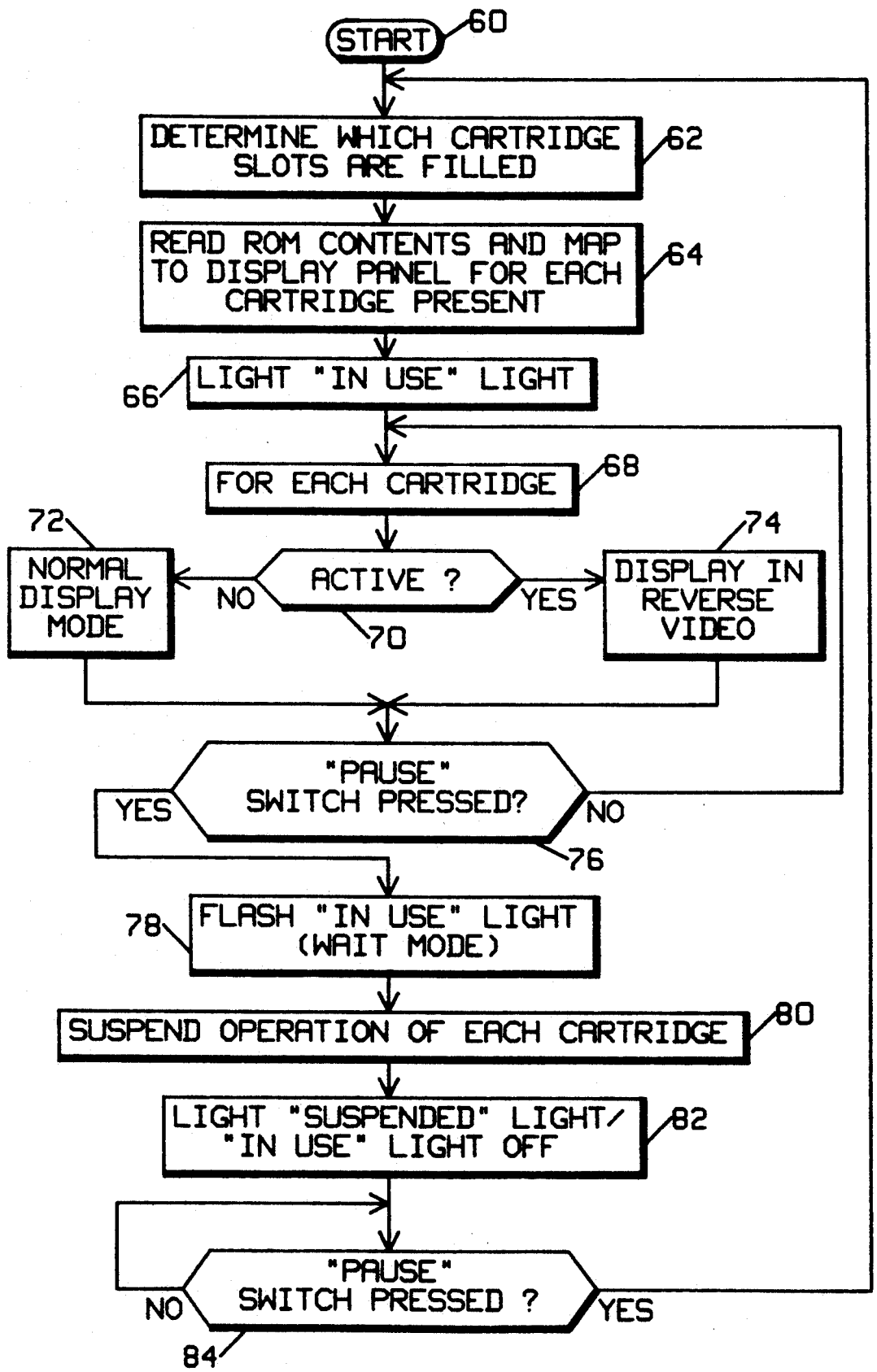
FIG. 2 shows a flow chart of the operation of the present invention.

Turning to FIG. 2, the operation of the system is described in flow chart form. The system is started at 60 after which the processor 12 determines which cartridges are present in the cartridge bank at step 62. This may be accomplished in many known ways. For example, each cartridge position is assigned an address and the processor polls each address to determine which cartridges acknowledge the poll. This can also be done by polling each available DIP switch selectable address to determine which addresses are present. This information can then be stored in a table in the processor's associated memory and/or disk storage. Other techniques may also be used. The processor 12 then reads the contents of each ROM at step 64 and stores the information in its internal memory. The ROM might contain, for example, the manufacturer and device type (e.g. INTEL 80386) along with clock speed (e.g. 33 Mhz) as well as other relevant information needed by the user and the hardware modeler.

Once the processor 12 has learned the vital information regarding each cartridge, it begins normal operation of the modeler and sends a message to the display interface 48 to light an "IN USE" LED at 66 indicating that the system is active and should not be tampered with. Then, for each cartridge at 68, the processor instructs the display interface to display information determined from the ROMs on the display/switch panel 50.

At step 70, the processor determines whether each cartridge is active or inactive. If inactive, the processor 12 instructs the display interface 48 to display the information for the inactive cartridge in its normal display mode at 72. If active, the processor instructs the display interface to display the information for the active cartridge in reverse video at 74. Those skilled in the art will appreciate that other mechanisms may be used to differentiate between active and inactive on the display. For example, high intensity, color, flashing, and other attributes can be assigned to the display to indicate that the cartridge is active. Control then passes to step 76.

At step 76, the pause switch is monitored. If it has not been pressed, control returns to step 68 so that the display is repeatedly updated as cartridges are brought into and out of service during the modeling process. If the pause switch has been pressed at 76 indicating that an operator wishes to suspend operation of the modeler cartridges, the processor instructs the display interface 48 to flash the "IN USE" light at 78 to indicate that the operator should wait while the operation of the modeler is suspended. The processor then inhibits access to any inactive cartridges and awaits completion of the current access cycle to any active cartridges and then inhibits future access to those cartridges at step 80. Inhibiting access can be accomplished by, for example, setting a flag associated with each cartridge location indicating that it is available or unavailable. Other techniques may also be used.

At this point it is safe to open the cartridge bank door to access cartridges for rearrangement, addition of cartridges, etc. At this point, the process is at step 84 awaiting another activation of the pause switch. Upon completion of such operations within the cartridge bank, the user closes the cartridge bank door and then again presses the pause switch. Since rearrangement of the cartridge bank could have taken place during the time that operation of the modeler was paused, control returns to step 62 for an initialization when the pressing of the pause switch is detected again at step 84.

Figure 3:
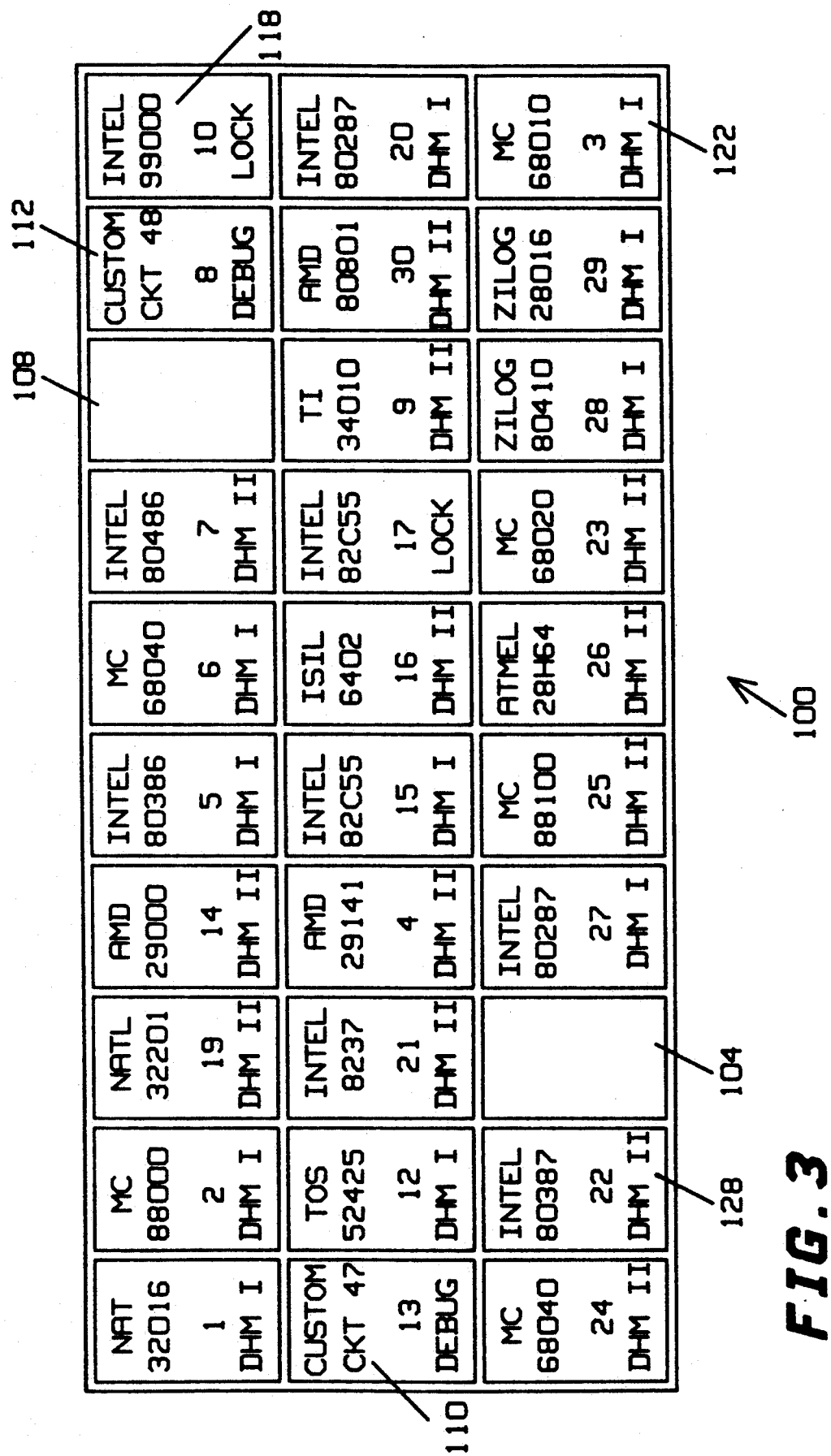
FIG. 3 is a display of a sample display screen of the present invention.

Turning now to FIG. 3, a sample display 100 is shown in a somewhat typical configuration representing an array of three rows of ten cartridges. Each display has several lines available for text stored in each cartridge's ROM or which may be entered from a keyboard. In FIG. 3, two of the cartridge slots 104 and 108 are empty as indicated by blank displays. Two others, 110 and 112 contain custom circuits being developed and debugged by the user.

Cartridge 118 represents a locked static cartridge that is dedicated to a single user's simulation. Since static cartridges do not forget the previous sequence of states as with a dynamic cartridge, they do not have to reproduce the previously applied vector sequence each time the cartridge is addressed. Accordingly, the cartridge is locked out and unavailable to all but a single user.

The remaining cartridges, as shown in the example, carry standard parts which are available in cartridge form. For example, cartridge 122 is shown to contain a Motorola MC68010 microprocessor and cartridge 128 contains an Intel 80387 math coprocessor. Each cartridge has a DIP switch or other mechanism for designating an address. Cartridge 122 is set for an address of 3 while cartridge 128 is set for an address of 22. In the preferred embodiment, the modeler is able to handle either cartridges designed for a previous generation of hardware modelers or for the current generation. These are commercially designated as DHM I and DHM II (Dynamic Hardware Modeler I and II). The bottom line of each cartridge's display indicates which generation the cartridge belongs to. Thus, cartridge 122 is from the earlier DHM I generation and cartridge 128 is from the later DHM II generation.

Figure 4:
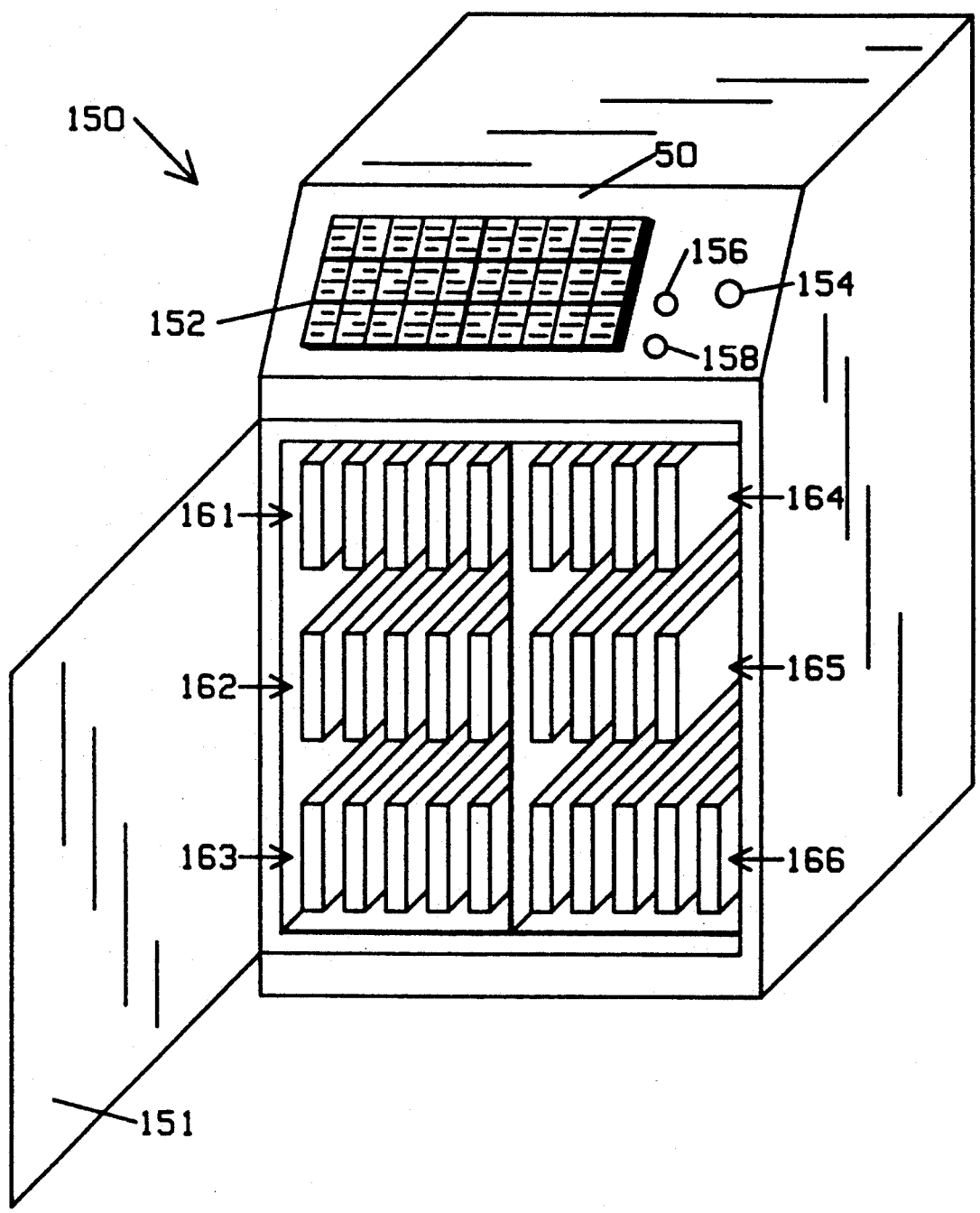
FIG. 4 is an illustration of the mechanical configuration of a hardware modeler.

Turning now to FIG. 4, an illustration of the housing configuration for the hardware modeler of the preferred embodiment of the present invention is shown and generally designated 150. For purposes of illustration, the housing door 151 is shown in the open position even though, as will become clear later, the display 152 indicates that four of the cartridges are active (and thus, the door should not be open). The display/switch panel 50, in this embodiment, is situated on an upper panel of the housing 150 above the cartridge slots. This display/switch panel 50 includes the LCD display 152 as well as pause switch 154, "IN USE" light 156 and "SUSPENDED" light 158. In the preferred embodiment, the housing is logically and physically arranged in six compartments 161 through 166 each potentially carrying a bank of up to five cartridges for a total of thirty cartridges. As illustrated, the right-most cartridge of banks 164 and 165 is not present. Other arrangements may also be used for varying user requirements and costs.

The display panel 152 can be similarly arranged to show six regions with five display areas per region in one embodiment as shown in this figure, or can simply show a three by ten array as in FIG. 3. The absence of cartridges in banks 164 and 165 is reflected in the display panel 152 by blank display areas in the corresponding region of the display. The display is arranged in a manner to correspond to the physical layout of the cartridge banks for easy correlation between display and cartridge bank. In this illustration, that means a two wide by three down array of regions corresponding to the cartridge banks with each region having five display areas across. In this example, four of the cartridges are indicated as being active by the shading of the correlating display areas representing the preferred reverse video display for active cartridges. Specifically, the second and fourth cartridge from the left in bank 161, the third cartridge in bank 164 and the fourth cartridge in bank 162 are shown as active by the shading of the display areas correlating to those cartridge representing reverse video display of the information.

Many variations of the present invention will occur to those skilled in the art without departing from the present invention. For example, rather than the display forming an integral part of the modeler cartridge housing as shown if FIG. 4, a separate display can be provided of a display from a separate terminal may be used. Color displays in lieu of the simple LCD panel may be substituted or simpler displays may be used. In color displays, a different color or color intensity can be used to represent active cartridges. Other variations will occur to those skilled in the art.

Thus it is apparent that in accordance with the present invention, an apparatus that fully satisfies the objectives, aims and advantages is set forth above. While the invention has been described in conjunction with specific embodiments, it is evident that many alternatives, modifications and variations will become apparent to those skilled in the art in light of the foregoing description. Accordingly, it is intended that the present invention embrace all such alternatives, modifications and variations as fall within the scope of the appended claims.

What is claimed is:

1. A status display system for a hardware modeler, comprising:
   a cartridge bank for carrying and electrically interfacing with a plurality of hardware model cartridges;
   a hardware model cartridge including storage means for storing identifying information for said hardware model cartridge;
   reading means for reading said identifying information from said storage means of said hardware model cartridge and for determining if said hardware model cartridge is active;
   display means for displaying at least a portion of said identifying information;
   active displaying means for displaying whether or not said hardware model cartridge is active; and
   wherein said active displaying means includes means for displaying identifying information relating to an active hardware model cartridge in reverse video.

2. The apparatus of claim 1, further comprising suspending means for suspending operation of said hardware modeler.

3. The apparatus of claim 2, wherein said suspending means comprises a switching means operable by a user, for inhibiting future calls to said hardware model cartridge when operated by said user.

4. The apparatus of claim 3, further comprising means for uninhibiting said future calls to said hardware model cartridges upon operation of said switching means while said future calls are inhibited.

5. The apparatus of claim 1, wherein said storage means includes a Read Only Memory (ROM).

6. The apparatus of claim 5, wherein said storage means includes a switch for storing an address assigned to said hardware model cartridge.

7. The method of claim 6 wherein said reading step includes the stop of sequentially reading said memory for each of said hardware model cartridges.

8. The method of claim 7, wherein said step of displaying an indication of whether or not each said hardware model cartridge is active includes displaying said portion of said identifying information with a predetermined display attribute.

9. The method of claim 7, wherein said step of displaying an indication of whether or not each said hardware model cartridge is active includes displaying said portion of said identifying information in reverse video.

10. The method of claim 7, further comprising the step of pausing operation of each of said hardware model cartridges.

11. The method of claim 10, further comprising the step of displaying an indication that said operation of said hardware model cartridges has been paused.

* * * * *